(12) United States Patent
Amir et al.

(10) Patent No.: US 6,601,007 B1
(45) Date of Patent: Jul. 29, 2003

(54) METHOD AND SYSTEM TO INCREASE THE PERFORMANCE OF HIGH-SPEED BACKPLANES

(75) Inventors: Israel Amir, Princeton, NJ (US); Frank Patrick Higgins, Ewing Township, NJ (US); Eric Sweetman, Princeton, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 9 days.

(21) Appl. No.: 09/607,837

(22) Filed: Jun. 30, 2000

(51) Int. Cl.$^7$ ............................................. G06F 19/00
(52) U.S. Cl. ...................... 702/107; 702/107; 702/110; 702/118; 702/189; 710/20; 710/29; 710/62; 714/100; 714/724; 714/824; 370/230; 370/282
(58) Field of Search .................. 702/110, 118, 702/85, 122, 107, 126, 127, 189–191, 194, 195, FOR 103–106, 134, 141; 710/1–7, 15, 18, 20, 21, 29, 31, 52, 55, 58, 60, 62, 65, 69, 70; 714/100, 724, 735, 824, 819, 799, 699; 370/230, 232, 234, 276, 277, 278, 282

(56) References Cited

U.S. PATENT DOCUMENTS

| 4,669,091 A | * | 5/1987 | Nossen | 375/14 |
| 2002/0034222 A1 | * | 3/2002 | Buchwald et al. | 375/232 |

OTHER PUBLICATIONS

Goslin et al., '16–Tap, 8–Bit FIR Filter Application Guide', Nov. 21, 1994, Xilinx, Version 1.01, pp. 1–5.*

* cited by examiner

Primary Examiner—Marc S. Hoff
Assistant Examiner—Elias Desta
(74) Attorney, Agent, or Firm—Woodbridge & Associates, PC

(57) ABSTRACT

A circuit board, for use with a high speed backplane, includes transmitter and receiver with circuitry for correcting for multipath signal errors. A training sequence that is often a pseudo-random signal is transmitted by the transmitter on a first circuit board to a receiver located on a second circuit board. The receiver on the second circuit board includes an analog-to-digital signal converter, an equalizer, and a binary digital-to-analog reconverter for receiving the training sequence. The equalizer preferably comprises a series of connected registers having taps in between, a plurality of individual weighting means attached to each of the taps, and a summing means connected to the weighting means. A training sequence is transmitted from the first circuit board to the receiver on the second circuit board, enabling the receiver to adaptively determine a set of weighting means coefficients for correcting the multipath errors in subsequent signals. Coefficients for the weighting means are then adjusted from the output of the summing means. The method and system described can substantially reduce the cost of backplane fabrication and enhance the performance of the overall system.

1 Claim, 2 Drawing Sheets

METHOD AND SYSTEM TO INCREASE THE PERFORMANCE OF HIGH-SPEED BACKPLANES

BACKGROUND OF THE INVENTION

1. Field of the Invention

Briefly described, the invention comprises a method and system for correcting multipath distortion (sometimes referred to as load mismatch, echoing or reverberations distortion) in a high speed backplane.

2. Description of Related Art

As technology evolves, the speed of digital components increases. Accordingly, the speed of the backplane buses must accommodate the increased speed of the components. Unfortunately, however, as the speed of the backplane bus increases, other problems arise. Those problems include:

1. Reverberations along the propagation path cause intersymbol interference (ISI). This cause of the reverberations can be traced to the fact that a backplane system comprises multiple inputs and multiple outputs that act like stubs in a transmission line.
2. The load on these ports is in most cases unknown. Sometimes these ports arc loaded, for example, when the boards are inserted in the backplane, and sometimes they are not.
3. Coupling may occur between the different paths along the backplane. Currently, very careful design steps have to be made to take into account these effects and, consequently, this limits design flexibility.

Multipath problems including reverberations, echoes and the like are known in other contexts. For example, ghosting, fading and multipath effects are known in high speed wireless transmission, especially in the GHz range. Echoes and the like are also well-known in telephony and techniques and devices are known to reduce those effects.

Several methods have been suggested and implemented for combating signal distortion due to load mismatch, reverberations and echoing. For short-size backplanes, a graded-impedance method may be used. On the other hand, an optical backplane may be used when all other distortion control methods fail, but tends to be very expensive. Both the graded impedance method and the optical backplane are thus well-known but remain niche solutions that are not widely accepted.

At the same time, a general need exists for correcting distortion in high-speed backplanes. As the backplanes become faster, the wavelength of the signals decrease, exacerbating distortion problems, which become especially severe as the wavelength of the signal involved comes very close to or, in many cases, is shorter than the physical length of the backplane itself. Furthermore, the nature of a backplane is different from a conventional transmission system and, accordingly, creative and novel means are needed to correct for multipath distortions that occur on high speed backplanes.

SUMMARY OF THE INVENTION

Briefly described, the invention comprises a method and system for correcting for multipath errors in a high-speed backplane. Each circuit board is equipped with a transmitter and a receiver, preferably located near the junction point on the socket in the backplane into which the circuit board is plugged. The signal transmitted from each board contains a training sequence in addition to the substantive bit-stream data. The circuit board receiving this training sequence will know the nature of the signal sent and thus be able to determine the distortions thereto so that corrections can be made to subsequently received signals. The receiver means on each circuit board preferably includes the following components: an analog-to-digital converter, an equalizer circuit, and, a binary digital-to-analog converter. The equalizer circuit, in turn, preferably comprises a series of registers, having taps in between, a plurality of adjustable weighing means attached to each of the taps and a summing means connected to the output of each of the weighting means. In the preferred embodiment the signal from the summing means is fed back to the weighting means in such a way as to adaptively correct subsequently received signals. Each circuit board plugged into the backplane takes turns transmitting training sequences to each of the other circuit boards plugged into the system until each circuit board has determined the correction factors necessary to reproduce an accurate signal. Since most backplanes operate at a constant clock speed, once the correction is determined, the values should remain fairly constant until a circuit board is either inserted or removed from the backplane.

These and other features of the invention will be more fully understood by reference to the following drawings.

DETAILED DESCRIPTION OF THE PREFERRED EMBODIMENT

During the course of this description like numbers will be used to identify like elements according to the different figures that illustrate the invention.

Figure 1:
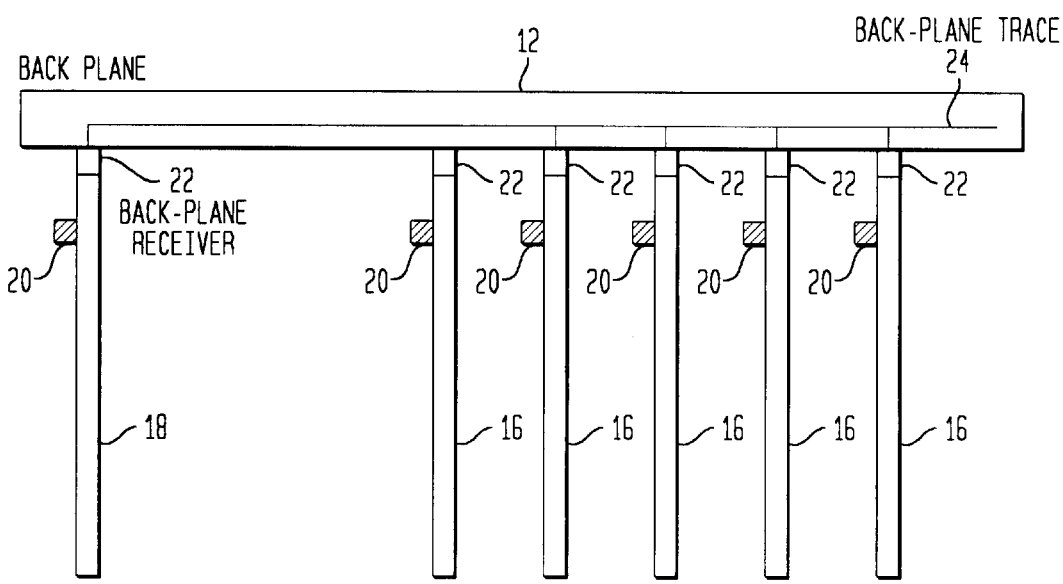
FIG. 1 illustrates the physical layout of a typical backplane with circuit boards inserted.

FIG. 1 illustrates the physical layout of a system 10, in accordance with the invention, for correcting the multipath effects of a backplane 12 with at least a first circuit board 16 and a second circuit board 18 that communicate with a backplane trace 24. In practice, several different circuit boards are inserted into the same backplane, which is used for communication between circuit boards as well as with other elements inserted into the backplane.

In this system 10, the first circuit board 16 contains a transmitter 20 and the second circuit board contains a receiver 22 for communication along the backplane. 12. Both transmitter and receiver are located near the junction point of their respective circuit boards 16 and 18. The first circuit board 16 also contains a receiver 22 and the second circuit board 18 also contains a transmitter 20 to facilitate two-way communication between the two boards. Each transmitter generates a training sequence 32 (FIG. 4) that is transmitted to the receiver 22 on a second circuit board 18 at relatively short intervals through the high speed backplane. The receiver 22 located on the second circuit board 18 then reads the training sequence signal 32 to determine parameters for correcting for multipath errors from subsequent signals.

Figure 2:
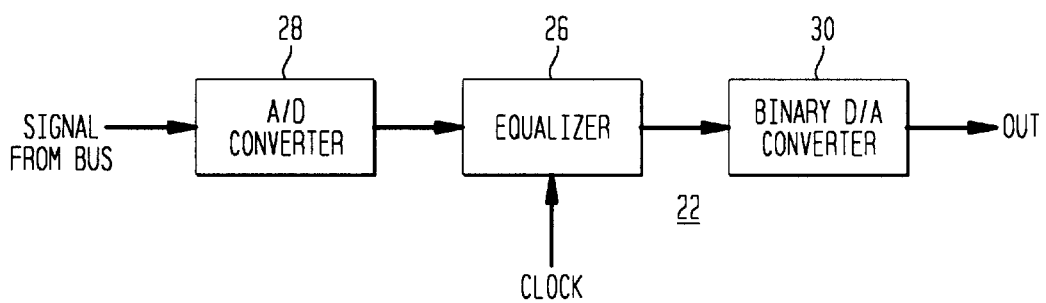
FIG. 2 illustrates three parts of a receiver means.

Referring to FIG. 2, the receiver 22 is comprised of three parts: an A/D converter 28 that is connected to an equalizer 26 that is in turn connected to a D/A converter 30. The A/D converter 28 is expected to have 4-bit resolution and the A/D converter 28 must have sufficient speed to accommodate the signal bandwidth. This is because the signal is typically a square wave, which has a very wide spectrum including higher frequencies, thereby requiring a higher speed A/D converter to properly sample the signal. The sampling rate must be a minimum of twice the highest frequency to satisfy the Nyquist criterion, but anywhere from 3–6 times the backplane speed will suffice, depending on how many harmonics of the square wave need to be sampled. For example, if the backplane rate is 100 MHz, the fastest alternating bit signal would be a 50 MHz square wave, and thus the sampling rate should be approximately 300–600 megasamples per second (MSPS) if one wanted to accommodate at least the third harmonic (150 MHz). Consequently, lower resolution A/D converters are used because they can run at a higher speed and are lower in cost. Moreover, if the transversal filter length should be 5 bits, the number of taps in the filter should thus be 20.

Figure 3:
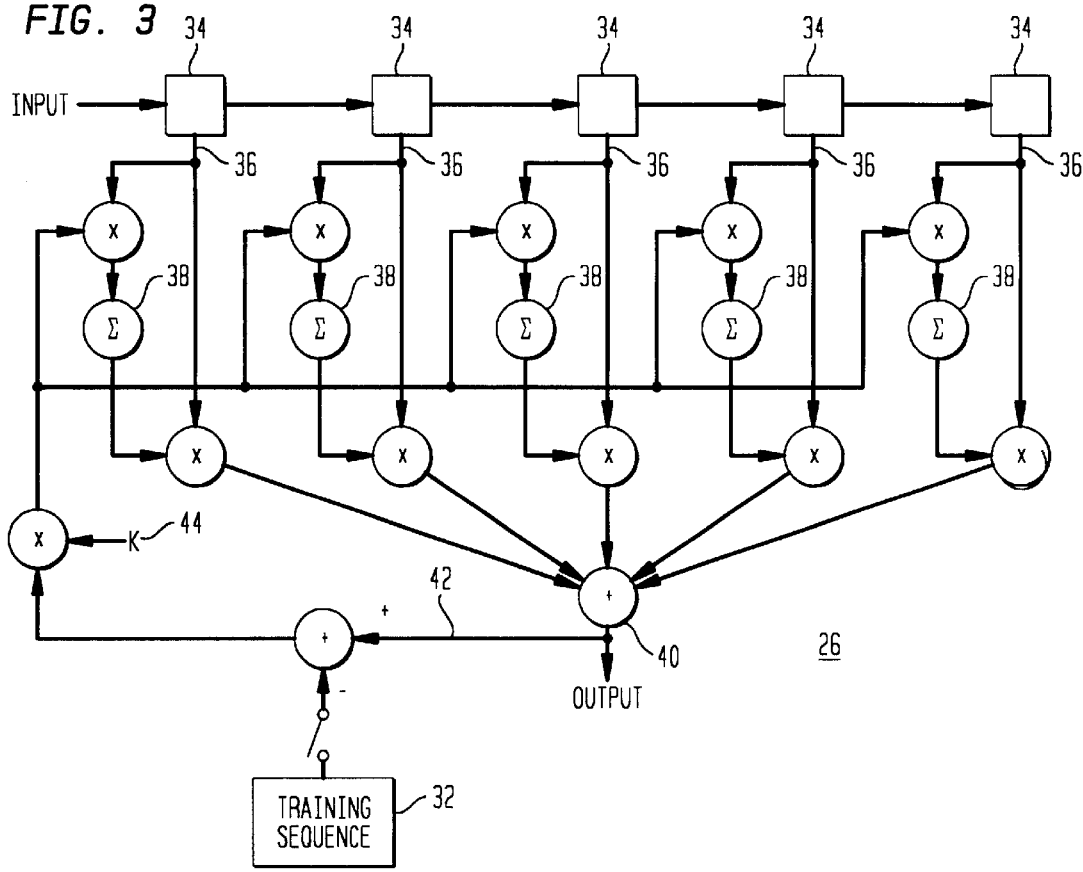
FIG. 3 illustrates an adaptive equalizer with a multi-tap delay.

Referring to FIG. 3, in the preferred embodiment, the equalizer 26, which is adaptive in nature, is implemented as a multi-tap delay filter, with a series of connected registers 34 having taps 36 in between. Empirically, the number of taps depends on both the bit length of the training sequence 32 multiplied by the ratio of sampling rate to backplane speed, which was noted above as 4. Thus in the present invention, a 5-bit training sequence would require a 20-tap delay filter.

Connected to each tap 36 is a weighting means 38 that adjusts the output of each tap 36 adaptively based on a feedback loop 42 that is connected to the output, which is obtained by the sum 40 of all the taps after they have been weighted. The feedback loop 42 has the additional provisions for a gain 44 as well as comparison with a training sequence 32, thereby providing adaptive adjustment of the weights based on the output of the equalizer 26. The output of the equalizer 26 is in turn connected to a D/A converter that reconverts the digital signal from the equalizer into either +V or −V analog signals, where +V and −V refer to the analog high and low of the digital signal.

The distortion correction process begins when a first circuit board 16 is plugged into a socket on the backplane 12. At that time, the transmitter 20 on the first circuit board 16 will transmit a training sequence 32 to a second circuit board 18 that is plugged into a second socket on the backplane. The receiver 22 reads this training sequence 32, which is in analog form, and converts the sequence into digital form before passing it to the equalizer 26. Within the equalizer 26, the now-digital signal is passed through a series of tapped registers 34. The signals then pass from the registers through the taps 36 into weighting functions 38, whereupon the weighted output signals are summed together using a summing function 40. The output of the summing function 40 becomes the ultimate output of the equalizer, which also connects to a feedback loop 42 that is in turn connected to each weighting function 38. The output of the equalizer feeds into the D/A converter for reconverting into an analog signal for use by the rest of the second circuit board 18.

The feedback loop 42 itself relies on comparing the signal with the known training sequence 32, which is preprogrammed or fed in using the general backplane signaling. (The training sequence 32 may also exist on a different layer for packet-based data). The multiplier value is updated every time a new training sequence is received based on a comparison between the output signal and the training sequence, and a higher gain K will lead to faster convergence. Once the difference between the training sequence and the equalizer output training sequence is below a user-specified threshold, the weighting coefficients are finally set and substantive bit-stream data is transmitted. This set of coefficients, or correction value, generally remains constant, as the system is generally stable because most backplanes operate at constant clock speed. The patterns of reverberation and multipath effects do not change once the boards have been plugged in, and so the training sequence primarily serves to configure communications when a circuit board is added or removed or when the entire system of backplane and boards is started.

Figure 4:
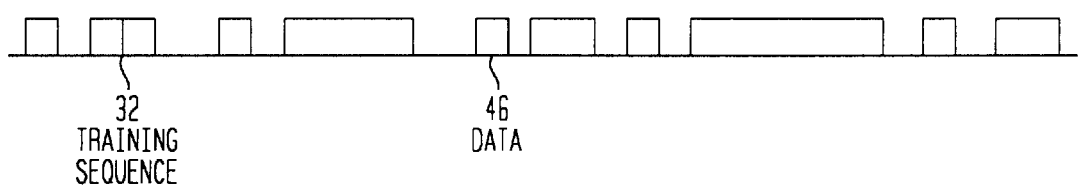
FIG. 4 illustrates a training sequence followed by bit stream data.

The training sequence 32 is added to the general backplane signaling and precedes the data bit-stream, as shown in FIG. 4. The sequence 32 may be part of the data stream, or it may be part of a header if there is a frame structure to the data stream. The sequence 32 may vary in size depending on the length of reverberations that, in turn, depends on the clock rate, size of the backplane, and the amount of impedance mismatch. The sequence 32 may last for 5–15 bits, and is often a pseudo-random signal. The training sequence 32 can be accurately detected using simple correlation or synch signals when available.

Because both the first and second circuit boards 16 and 18 each have both a transmitter 20 and receiver 22, the second circuit board 18 can transmit a second training sequence 32 back to the first circuit board, whereupon a similar adaptive equalization process takes place. In this manner, the first and second circuit boards 16 and 18 can communicate with each other once correction has taken place in both directions. This process repeats itself between all of the other pairs of circuit boards that are inserted into the backplane and that communicate with each other. Each circuit board takes turns transmitting training sequences to each of the other circuit boards plugged in until each circuit board has determined the weighting coefficients needed to reproduce an accurate signal. In this way, the training sequence 32 thus serves to calibrate the adaptive equalizer 26 found in the receivers 22 found on both of the circuit boards that are added to a backplane 12 as well as the circuit boards already plugged into the backplane 12.

Note that this technique of adaptive equalization works well for a single transmitter and multiple receivers but is less ideal when there are multiple transmitters transmitting towards a single receiver as each transmitter would create a different multipath that will have to be independently corrected by the single receiver.

One alternative embodiment of the invention uses the same equalization technique but without the use of a training sequence for the adaptive equalizer. If the bit error rate (BER) is guaranteed to be low (for example, below 0.01— but not low enough to obviate use of the system altogether), the system can train itself. In this case, the system would just detect the bit stream and use it to define the equalizer coefficients based on what the system believes to be the correct bits in the bit stream. In other words, the system assumes that the data bits received at the equalizer input is reasonably close to what was transmitted and just performs the tap delay equalization to clean up the signal. However, a training sequence is recommended if the BER is high because the equalizer 26—and thus the receiver 22—would otherwise have no way of knowing if the data bit signal is identical to that being sent by the transmitted.

Figure 5:
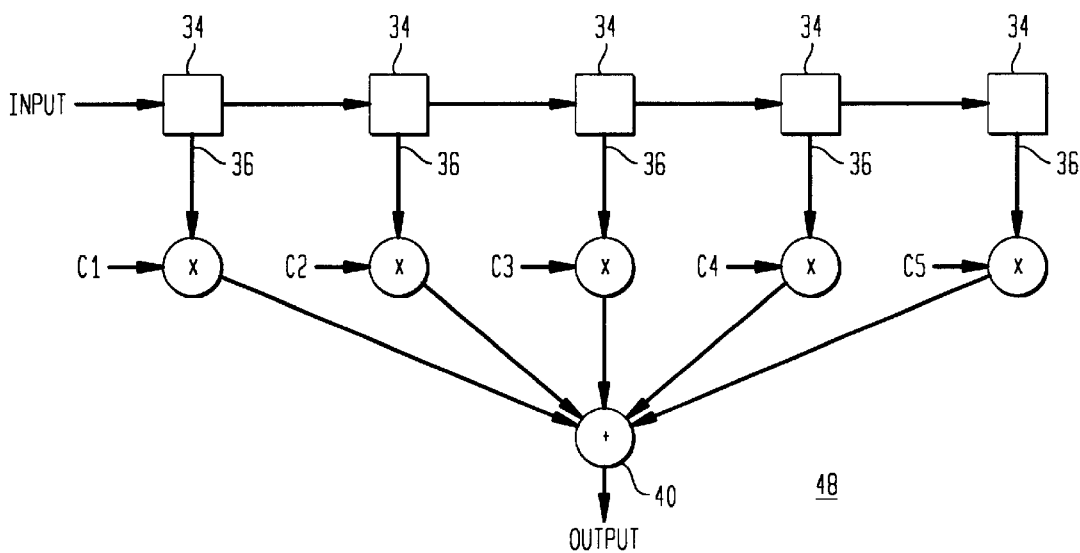
FIG. 5 illustrates a transversal filter (constant coefficient) implementation of the invention.

In another alternative embodiment, the weighting coefficients of the multi-tap delay filter may be implemented as constants rather than through adaptive equalization as shown in FIG. 5. The filter coefficients C1, C2, C3, C4, and C5 are all determined through experimentation and/or simulation, and may prove less expensive than using adaptive equalization circuitry or adding a training sequence to the signal. In this embodiment, different sets of coefficients may be loaded for different circuit board configurations on a given backplane. This embodiment is best implemented where the propagation characteristics for all backplanes are similar and consistent.

The present invention thus presents an easier way to correct the multipath problems found in high speed backplanes. Although adaptive equalization or transversal filter equalization methods are found in wireless or other applications, these methods nevertheless provide for a novel way for addressing the multipath distortion problems found in high speed backplanes.

While the invention has been described with reference by the preferred embodiment thereof, it will be appreciated by those of ordinary skill in the art that modifications can be made to the structure and elements of the invention without departing from the spirit and scope of the invention as a whole.

We claim:

1. A system for correcting the multipath distortion in a high-speed backplane with a plurality of sockets for receiving circuit boards comprising:

a. a first transmitter means located on a first circuit board plugged into a first of said sockets for transmitting a training sequence to a second board;

b. a first receiver means located on a second circuit board plugged into a second socket on said backplane for receiving said training sequence and for determining a correction value to correct for multipath distortion from subsequent signals, said first receiver means comprising;
 (1) an analog-to-digital converter for receiving said training sequence;
 (2) an equalizer means having an input connected to said analog-to-digital converter and an output; and,
 (3) a binary digital-to-analog converter having an input connected to the output of said equalizer means and an output connected to the rest of the circuit on said second circuit board;

c. a second receiver means located on said first circuit board; and, d. a second transmitter means located on said second circuit board, wherein said second transmitter means transmits a training sequence through said backplane to said second receiver means which also receives said training sequence and determines a correction value to correct for multipath errors from subsequent signals; and, wherein said training sequence is a pseudo-random signal and said training sequence constitutes 1–10% of the total signal cycle time.

* * * * *